(12) United States Patent
Yonekawa et al.

(10) Patent No.: US 7,911,588 B2
(45) Date of Patent: Mar. 22, 2011

(54) EXPOSURE APPARATUS AND ORIGINAL

(75) Inventors: Masami Yonekawa, Utsunomiya (JP);
Mitsuru Inoue, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 449 days.

(21) Appl. No.: 12/056,770

(22) Filed: Mar. 27, 2008

(65) Prior Publication Data
US 2008/0246939 A1    Oct. 9, 2008

(30) Foreign Application Priority Data

Apr. 6, 2007   (JP) .................................. 2007-100584

(51) Int. Cl.
*G03B 27/62* (2006.01)
(52) U.S. Cl. ......................................................... 355/75
(58) Field of Classification Search .................... 355/53, 355/75; 430/5
See application file for complete search history.

(56) References Cited

U.S. PATENT DOCUMENTS 6,781,673 B2    8/2004   Moors et al.
2005/0040345 A1    2/2005   Bakker et al.

FOREIGN PATENT DOCUMENTS

| JP | 08-124822 | 5/1996 |
| JP | 2002-124463 A | 4/2002 |
| JP | 2005-043895 A | 2/2005 |
| JP | 2006-120774 A | 5/2006 |
| JP | 2006-120776 A | 5/2006 |
| JP | 2007-329288 A | 12/2007 |

OTHER PUBLICATIONS

Masuda, et al., IEEE translation from Trans. IEE Japan., pp. 9-18, vol. 92B, No. 1, 1972.

*Primary Examiner* — Peter B Kim
(74) *Attorney, Agent, or Firm* — Canon U.S.A., Inc., IP Division

(57) ABSTRACT

An exposure apparatus configured to expose a pattern of an original onto a substrate includes a wire electrode row that includes plural parallel wire electrodes, and that is opposed to the original, and a power source that applies an AC voltage to the plural wire electrodes, wherein the wire electrode row includes a first electrode group, and a second wire electrode group to which an AC voltage having a phase different from that of an AC voltage applied to the first electrode group is applied.

4 Claims, 22 Drawing Sheets

EXPOSURE APPARATUS AND ORIGINAL

BACKGROUND OF THE INVENTION

The present invention relates to an exposure apparatus and an original. The exposure apparatus of the present invention is suitable, for example, for an exposure apparatus that uses extreme ultraviolet ("EUV") light for exposure light.

Currently, for manufactures of semiconductor devices, such as DRAMs and MPUs, a vigorous research and development has been performed for an implementation of a device having a design rule of a critical dimension ("CD") of 50 nm or smaller. An exposure apparatus that utilizes EUV light (EUV exposure apparatus) is expected as a prospective exposure apparatus for this generation. In the EUV exposure apparatus, an optical path of the EUV light is maintained under the vacuum environment so as to prevent absorptions of the EUV light in the gas.

In general, a semiconductor exposure apparatus transfers onto a substrate (e.g., a wafer) a reduced size of a circuit patterned image of an original, such as a reticle or a mask, via a projection optical system. When a particle or a fine foreign matter adheres to a circuit patterned surface of the patterned surface of the reticle, an image of the particle is transferred each shot at the same position. The adhesion of the particle causes lowered yield of the semiconductor device manufacture and the degraded reliability of a semiconductor device itself.

As a solution for this problem, an exposure apparatus that uses a mercury lamp and an excimer laser for a light source arranges a transparent protection film called a pellicle apart from the reticle by several millimeters, and suppresses direct adhesions of particles onto a circuit patterned surface and transferring of particle images.

The pellicle has a thickness of about scores of nanometers to satisfy the transmittance required for the EUV exposure apparatus. This very thin pellicle cannot provide a sufficient strength mechanically or thermally. It is really difficult for the EUV exposure apparatus to prevent adhesions of particles using the pellicle that includes only a transparent protection film.

Prior art include, for example, Japanese Patent Laid-Open Nos. 2005-43895 and 2002-124463.

Japanese Patent Laid-Open No. 2005-43895 is insufficient in that use of a film having a thickness of about 30 nm to 300 nm for the pellicle remarkably lowers the transmittance to the EUV light (13.5 nm) down to about 50%, causing the lowered throughput. The pellicle film made of the above material is likely to oxidize and degrades its durability and handling easiness. Moreover, a wire mesh of 10 μm is used to support a film of 30 nm to 300 nm, and its manufacture would be extremely difficult. Even if it is applicable to a rectangular wind of 22 mm×8 mm used to separate the projection optical system space from the wafer stage space in the exposure apparatus, it appears to be difficult to manufacture the wire mesh that covers the entire reticle surface having a size of about 150 mm×150 mm. It is thus extremely difficult to put a filter wind for the EUV exposure apparatus proposed in Japanese Patent Laid-Open No. 2005-43895 to practical use as a pellicle.

Japanese Patent Laid-Open No. 2002-124463 is one conceivable solution for these problems but also insufficient. This reference uses a plane-parallel plate electrode only for the EUV light passing zone near the reticle to generate the electric field. It is possible to exclude incoming fine particle around the EUV light passing zone, but impossible to exclude particles that occur in other zones, such as particles that might occur when the reticle stage accelerates or decelerates in the reticle stage space. If the plane-parallel plate can generate the electric field throughout the reticle stage space, particles can be restrained in accelerating and decelerating the reticle stage. However, in that case, when the desired electric field of 33 kV/m in this specification is sought, the applied voltage of scores of kilovolts is needed, causing discharges and gas molecules sputtering, and finally increasing particles. Another embodiment illustrates use of a wire mesh, but the electric field occurs only between the reticle and the wire mesh in order to capture the electrons generated by the EUV light irradiations. Even if this wire is used to capture the particles, there are some particles that cannot be captured due to the polarity, and the wire is an insufficient restraining means.

SUMMARY OF THE INVENTION

The present invention is directed to an exposure apparatus and original to prevent adhesions of dust (particles) to the original.

An exposure apparatus according to one aspect of the present invention is An exposure apparatus configured to expose a pattern of an original onto a substrate includes a wire electrode row that includes plural parallel wire electrodes, and that is opposed to the original, and a power source that applies an AC voltage to the plural wire electrodes, wherein the wire electrode row includes a first electrode group, and a second wire electrode group to which an AC voltage having a phase different from that of an AC voltage applied to the first electrode group is applied.

An original according to another aspect of the present invention having a pattern to be exposed onto a substrate includes a wire electrode row that includes plural parallel wire electrodes, a contact configured to electrically connect the wire electrode and a power source that applies an AC voltage to the plural wire electrodes, wherein the wire electrode row includes a first electrode group, and a second wire electrode group to which an AC voltage having a phase different from that of an AC voltage applied to the first electrode group is applied.

A further object and other characteristics of the present invention will be made clear by the preferred embodiments described below referring to accompanying drawings.

DESCRIPTION OF THE EMBODIMENTS

Figure 1:
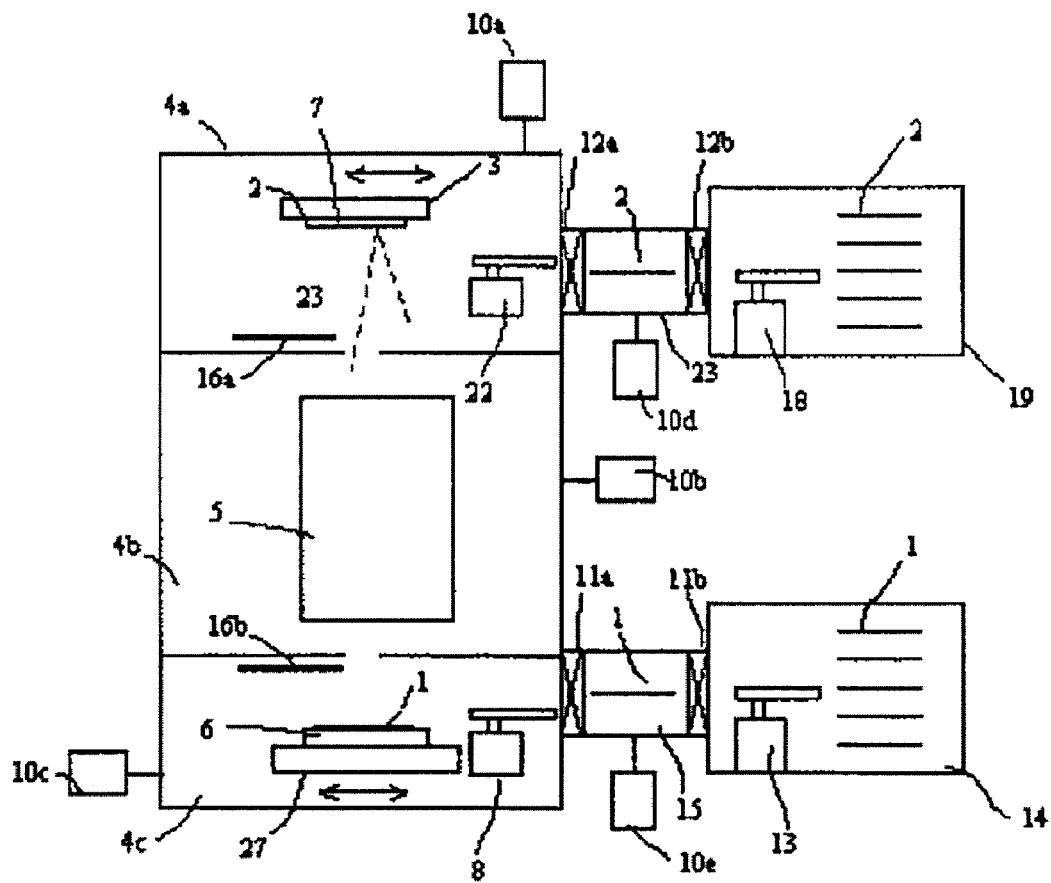
FIG. 1 shows a EUV exposure apparatus system applicable to the present invention.

Referring now to the accompanying drawings, a description will be given of the present invention. In each figure, those elements which are the same as corresponding elements are designated by the same reference numerals, and a description thereof will be omitted.

Referring to FIG. 1, a description will be given of an EVU exposure apparatus of this embodiment. The EUV exposure apparatus of this embodiment can restrain adhesions of particles to the reticle.

In FIG. 1, 1 denotes a wafer. 2 denotes a reflection reticle that has an electric circuit pattern. 7 denotes a reticle chuck that holds and fixes the reflection reticle. 3 denotes a reticle stage that provides rough movements to the reticle in the scanning direction. A reticle chuck is provided on the reticle stage, and the reflection reticle is placed on the reticle chuck. The reticle 3 is illuminated by the light from an illumination optical system (not shown). The EUV exposure apparatus of this embodiment arranges near the reticle 2 an electric field means for restraining incoming particles.

5 denotes a projection optical system that projects the EUV reflected light from the reticle onto the wafer 1. 6 denotes a wafer chuck that holds and fixes the wafer. 27 denotes a wafer stage that can provide both rough and fine movements in the six axes directions, and its xy position is always monitored by a laser interferometer (not shown). $1/\beta$ is a reduction ratio of the projection optical system, Vr is a scanning speed of the reticle stage 3, and Vw is a scanning speed of the wafer stage 27. A synchronous control is performed for both scanning speeds so that a relationship of $Vr/Vw=\beta$ can be met.

The exposure is excised in the vacuum environment, and it is necessary to maintain vacuum the inside of the exposure chamber in the exposure apparatus. Here, the reticle stage is housed in a reticle stage space 4a of the exposure chamber. The projection optical system is housed in a projection optical system space 4b in the exposure chamber. The wafer stage is housed in a wafer stage space 4c in the exposure chamber. These respective spaces are independently provided with vacuum pumping units 10a, 10b, and 10c so that their pressures can be controlled independently.

15 denotes a wafer load lock chamber. 8 denotes a carrier hand that carries the wafer between the wafer load lock chamber and the wafer stage. 10e denotes a vacuum pumping unit of the wafer load lock chamber. 11a denotes a wafer stage space side gate valve that connects the exposure chamber to the wafer load lock chamber 15. 11b denotes a wafer exchange chamber side gate valve, which will be described later. 14 denotes a wafer exchange chamber which temporarily stores the wafer under the atmosphere pressure. 13 denotes a carrier hand that imports the wafer in and exposes the wafer from the load lock chamber.

23 is a reticle load lock chamber. 22 denotes a carrier hand that carries the reticle between the reticle load lock chamber and the reticle stage. 10d denotes a vacuum pumping unit of the reticle load lock chamber. 12a denotes a reticle stage space side gate valve that connects the exposure chamber and the reticle load lock chamber 23. 12b denotes a reticle exchange chamber side gate valve, which will be described later. 19 denotes a reticle exchange chamber that temporarily stores the reticle under the atmosphere pressure. 18 denotes a carrier hand that imports the reticle in and exports the reticle from the load lock chamber.

The EU exposure apparatus of this embodiment is thus explained.

In order to solve a problem of adhesions of the particles to the reticle which occur in the exposure in the exposure apparatus, the EUV exposure apparatus of this embodiment provides multiple wire electrodes near the reticle. Moreover, the EUV exposure apparatus uses a technology that forms a periodic non-uniform electric field by alternately applying to the wire the AC voltages in which phases are different by 180°, and restrains the incoming particles.

Figure 2:
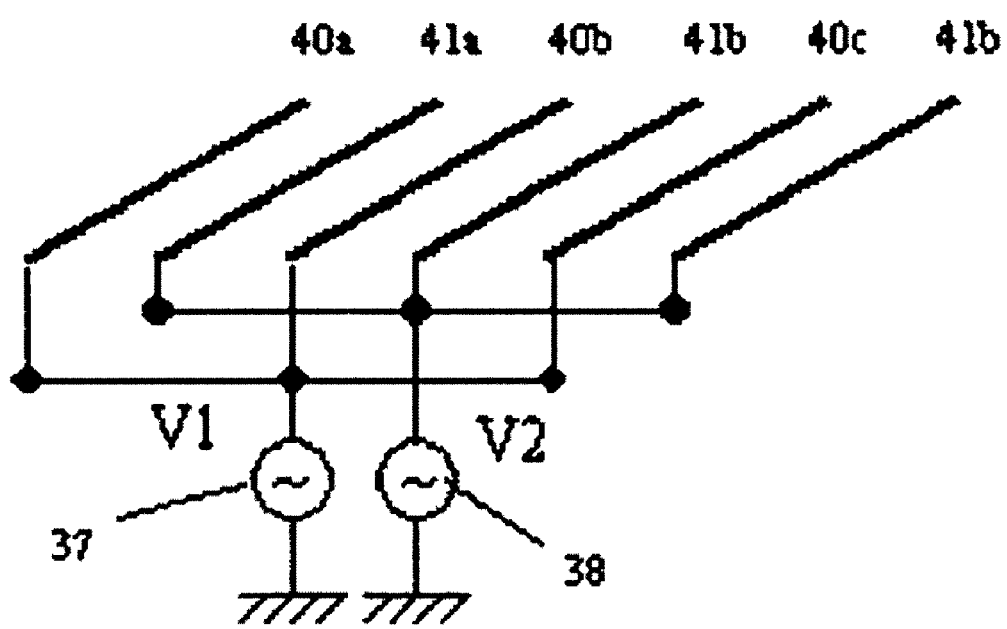
FIG. 2 shows an AC voltage application method to a first wire electrode according to a first embodiment.
Figure 3:
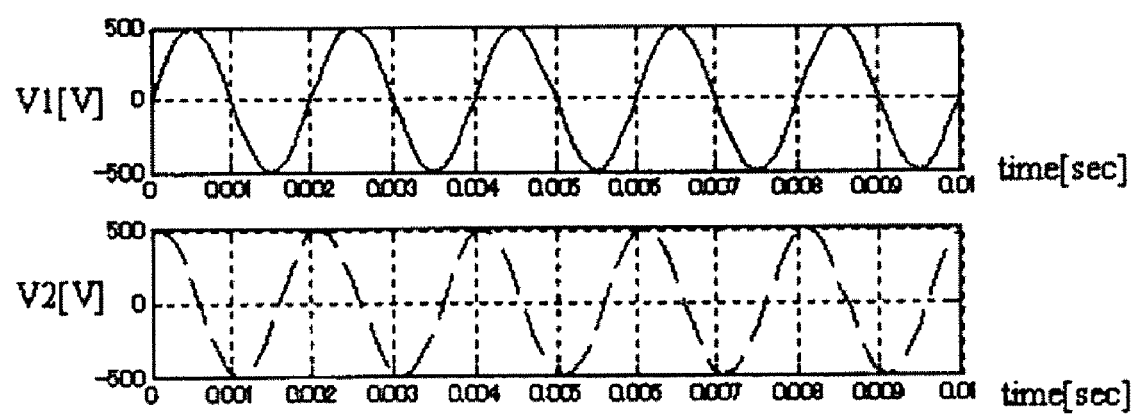
FIG. 3 shows an AC voltage waveform having a different first phase in the first embodiment.

The principle of this technology is disclosed in Masuda, S., K. Fujibayashi, K. Ishida and H. Inaba, IEEE translation from Trans. IEE, Japan, 92B, 9-18 (1972). Referring to FIGS. 2 and 3, a description will be given of this principle. Initially, the AC voltage having a different phase is alternately applied to multiple wire electrodes. In other words, AC voltage V1 (having, for example, an amplitude of ±500 V and a frequency of 500 Hz) is applied to a first wire electrode group that includes wire electrodes 40a, 40b, and 40c shown in FIG. 2. AC voltage V2 (having, for example, an amplitude of ±500 V and a frequency of 500 Hz) is applied to a second wire electrode group that includes wire electrodes 41a, 41b, and 41c but a phase of V2 shifts by 180° to that of V1 as shown in FIG. 3.

Figure 4:
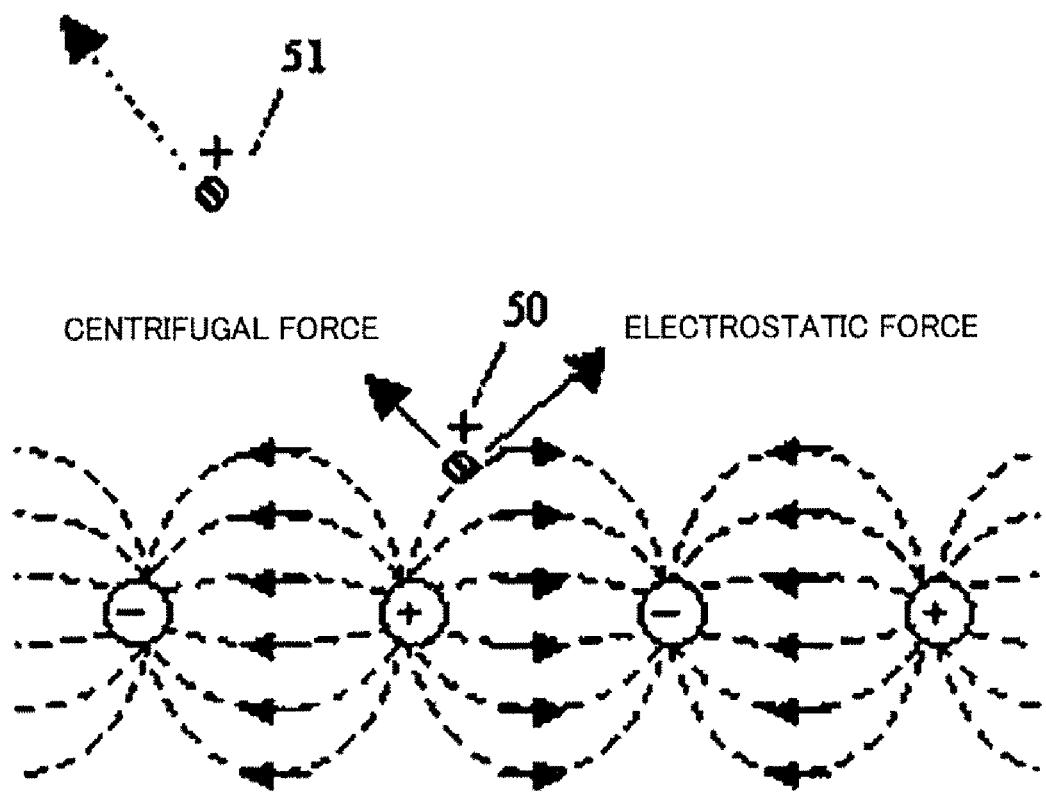
FIG. 4 is an explanatory view of a principle of an electric field pellicle upon which the present invention relies.

Thus, a periodic non-uniform electric field according to the AC frequency is formed around the electrode as shown in FIG. 4. When a charged particle 50 moves to this electrode row, the particle vibrates along the curved electric line of force due to the electrostatic force. Thereby, the centrifugal force occurs in a direction moving apart from the electrode row, and the particle 51 can be repelled from the electrode row. Even when the particle is not charged, the electric field is a non-uniform electric field and receives a force in the direction moving apart from the electric row, similar to the charged particle, due to the induced charge on the particle surface. Therefore, this electrode row serves as a barrier against the particle invasions.

This embodiment applies this principle to the EUV exposure apparatus, and characteristically enables the multiple wire electrodes to serve as the conventional pellicle. This configuration will be referred to as an electric field pellicle.

Figure 5:
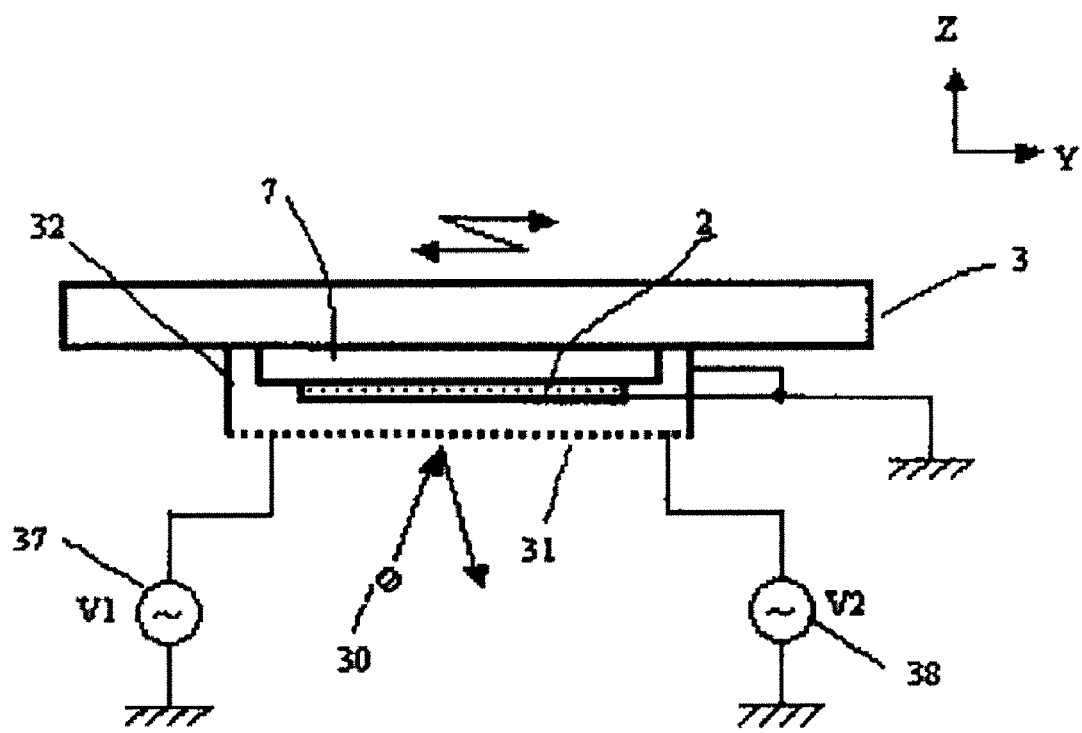
FIG. 5 is a front view of the electric field pellicle of the first embodiment.

A description will be given of the first embodiment. FIG. 5 is a front view of a structure of this embodiment. This embodiment provides the electric field pellicle to the stage. 2 denotes the reticle, and has a patterned surface on its bottom surface. The EUV light emitted from the illumination optical system is incident upon the reticle from the bottom, reflected on the reticle patterned surface, and incident upon the projection optical system. 7 denotes a chuck configured to absorb and hold the reticle, and provided to the reticle stage 3 for the reticle via a fine movement mechanism. The scanning direction of the reticle stage 3 is a y direction in FIG. 5.

The reticle 2 is held on the reticle chuck 7 using an electrostatic chuck. When the voltage is applied to the reticle chuck 7, the charge is induced to the reticle surface, and the unnecessary electric field occurs between the reticle surface and the wire electrode. The patterned surface is grounded and maintained at 0 V. 31 denotes a wire electrode that entirely covers the reticle patterned surface. A conceivable material is, for example, SUS, but may use another material, as long as it is durable and processed into a thin line. For example, gold, platinum, Cr, and Ni is conceivable. In this embodiment, a direction of the wire electrode (a longitudinal direction of the wire electrode) is orthogonal to the scanning direction. In the EUV exposure apparatus, an illumination optical system has a small NA of 0.1 or smaller, the influence of the polarization is small, and the wire's direction is not particularly limited. Therefore, the wire electrode direction does not have to be orthogonal to the scanning direction and may be parallel to or tilted to it by an arbitrary angle.

Figure 6:
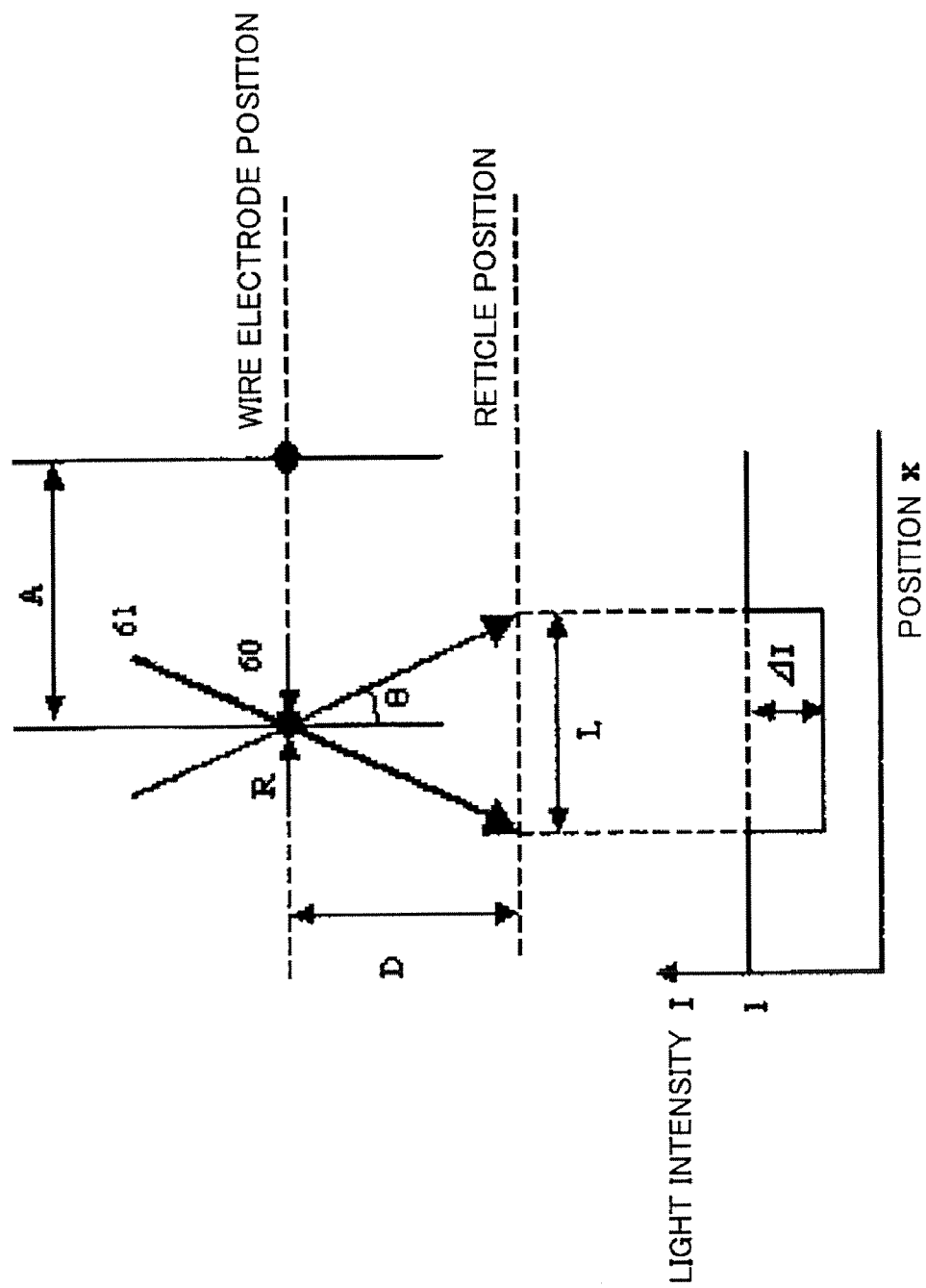
FIG. 6 is an explanatory view between a wire diameter R and a wire interval A of the present invention.

A wire diameter R and a wire interval A of the wire electrode are generally given as follows. In FIG. 6, 60 denotes a wire section with a line diameter R. D is an interval between the wire electrode and the reticle. 61 denotes the illumination light, and it is assumed that the illumination optical system has an NA of sin θ.

In this case, the illuminance reduction ΔI by the wire is approximately as R/L. In order to control the illuminance reduction ΔI, the wire diameter R needs to meet the following equation:

$$R < \Delta I \times L \quad \text{EQUATION 1}$$

Similarly, the wire interval A needs to meet the following equation so that the shadows of the adjacent wires do not overlap each other:

$$A > L \quad \text{EQUATION 2}$$

The interval D is restricted by a designed physical restriction distance D0 of the reticle stage.

$$D < D0 \quad \text{EQUATION 3}$$

As discussed, the wire diameter R and the wire interval A simultaneously meet Equations 1 to 3.

More specifically, it is reasonable to set the wire diameter R smaller than 100 μm and the wire interval greater than 100 μm, although values of the wire diameter and the wire interval are up to the incoming particle speed and the number of charged particles.

Turning back to FIG. 5, 32 denotes a wire electrode frame that supports the wire electrode 31, and fixes it onto the reticle stage. This wire electrode frame 32 is made of metal as a conductive member and grounded so as to reduce the electric noises as small as possible that would occur when the electric field that occurs in the wire electrode 31 leaks in an area other than the frame. 37 and 38 are power sources that alternately apply AC voltages having different phases to each wire electrode. The AC electric field that occurs in this wire electrode 31 prevents the incoming of the particle 30 onto reticle patterned surface.

Figure 7:
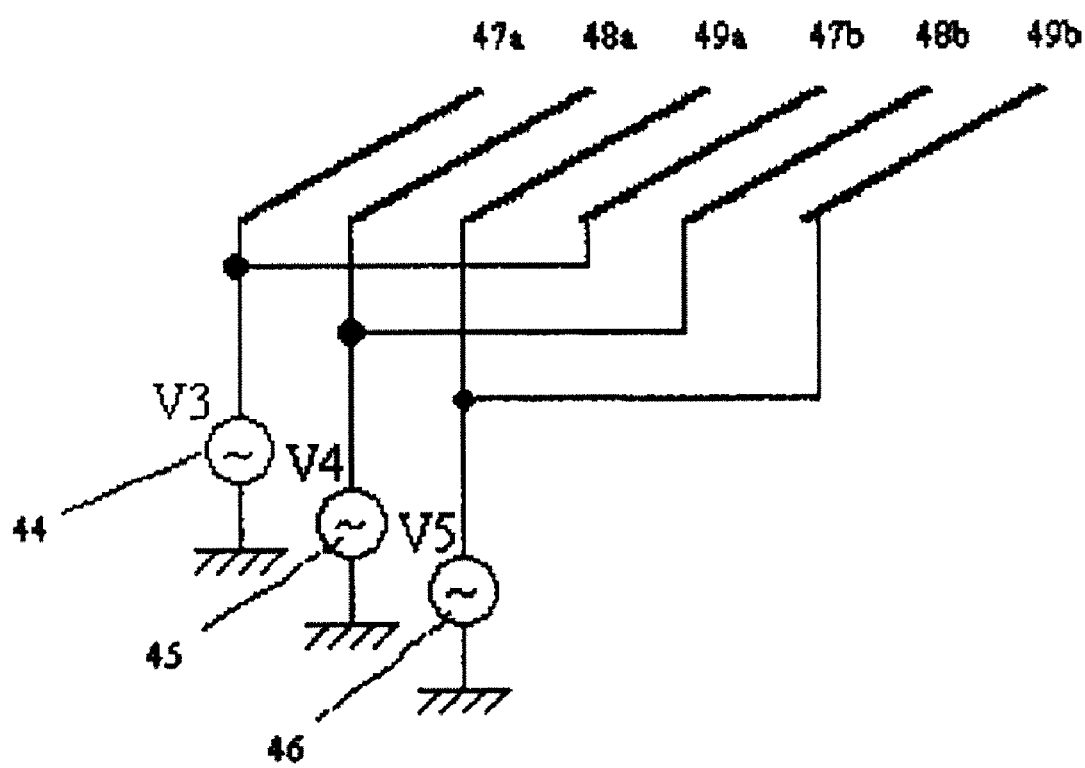
FIG. 7 is an AC voltage application method to a second wire electrode according to the present invention.
Figure 8:
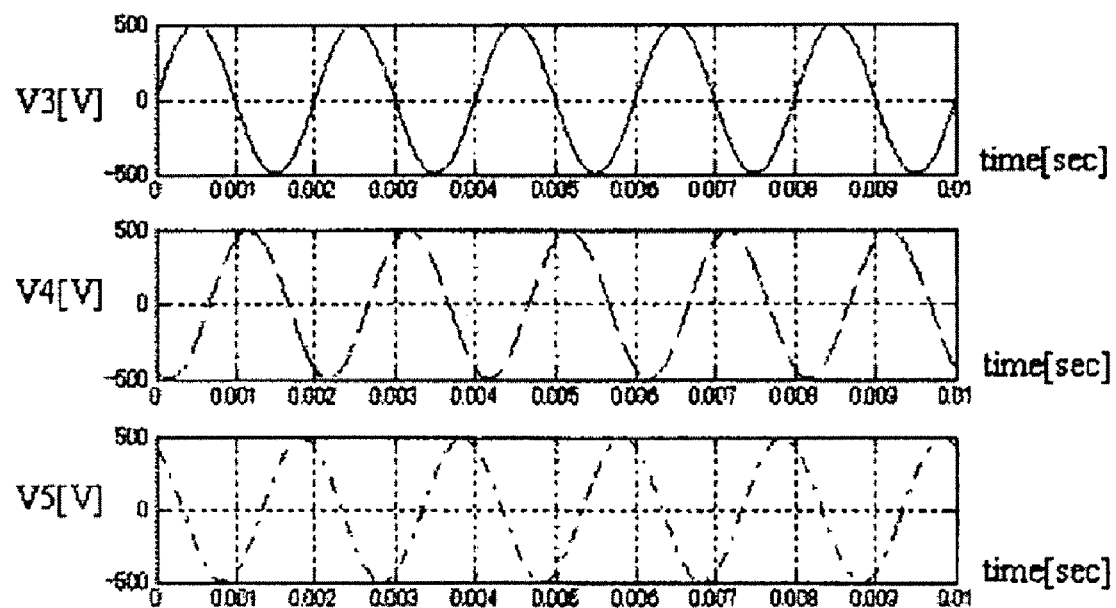
FIG. 8 shows an AC voltage waveform having a different second phase in the first embodiment.

This embodiment adopts the voltage application method that alternately applies voltages having different phases by 180°, but a variation is conceivable which generates a progressive wave of the AC electric field around the electrode by shifting an applied phase every 120° for three wire electrodes. More specifically, as shown in FIGS. 7 and 8, a voltage V3 is applied to a first wire electrode group that includes electrodes 47a and 47b. A voltage V4 that has a phase faster than that of V3 by 120√ is applied to a second wire electrode group that includes electrodes 48a and 48b, as shown in FIG. 8. Moreover, a voltage V5 that has a phase faster than that of V4 by 120° is applied to a third wire electrode group that includes electrodes 49a and 49b. Thereby, the progressive wave of the AC electric field can be generated near the wire electrode row. A voltage application method that alternately applies to each wire voltages having phases that are different from each other by 180° simply repels incoming particles near the electrode at random. On the other hand, this three-phase AC voltage, which is used to generate a progressive wave of the AC electric field at an electrode, can repel the incoming particle only to a specific direction to some extent. For example, if it is assumed that the y direction in FIG. 5 is a direction of the progressive wave of the AC electric field, the particles repelled by the reticle are moved in the y direction.

Figure 9:
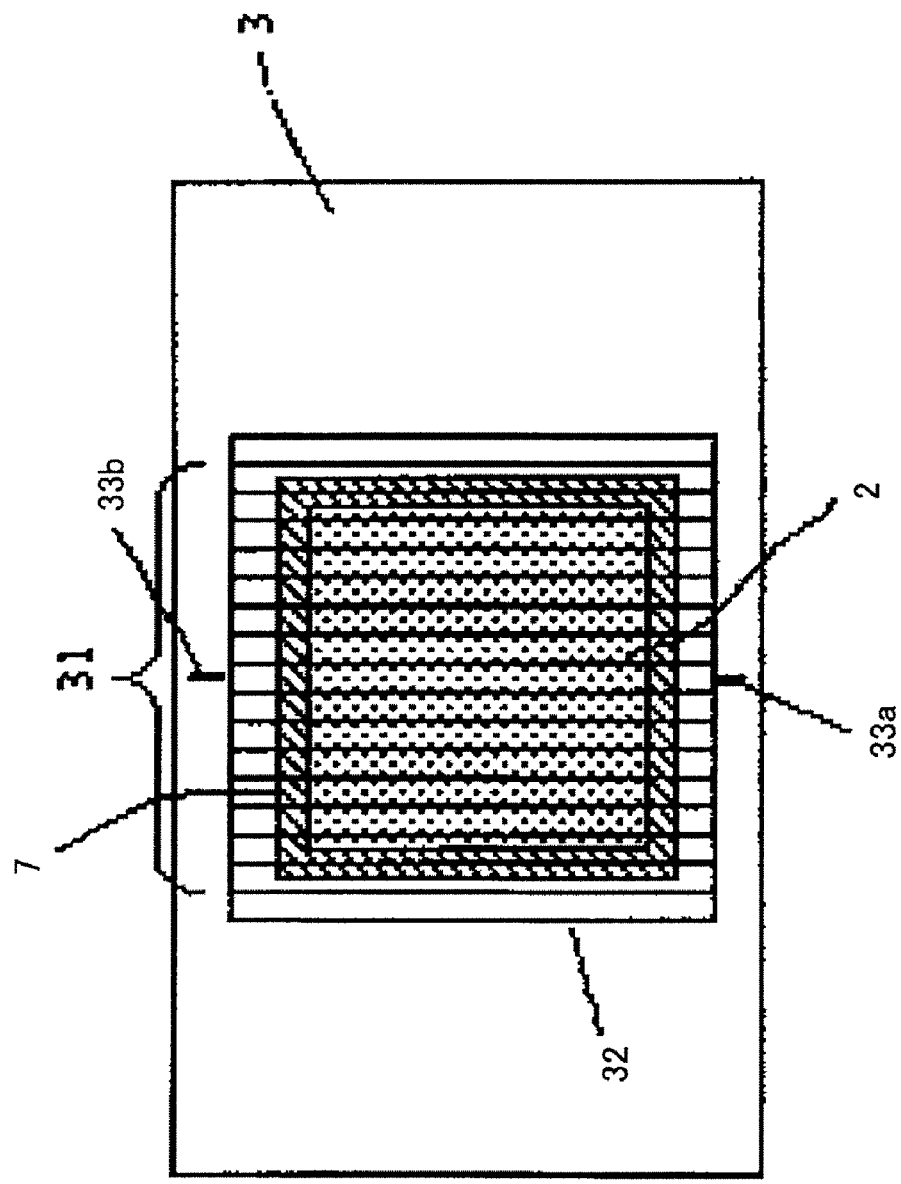
FIG. 9 is a plane view of an electric field pellicle according to a first embodiment.
Figure 10:
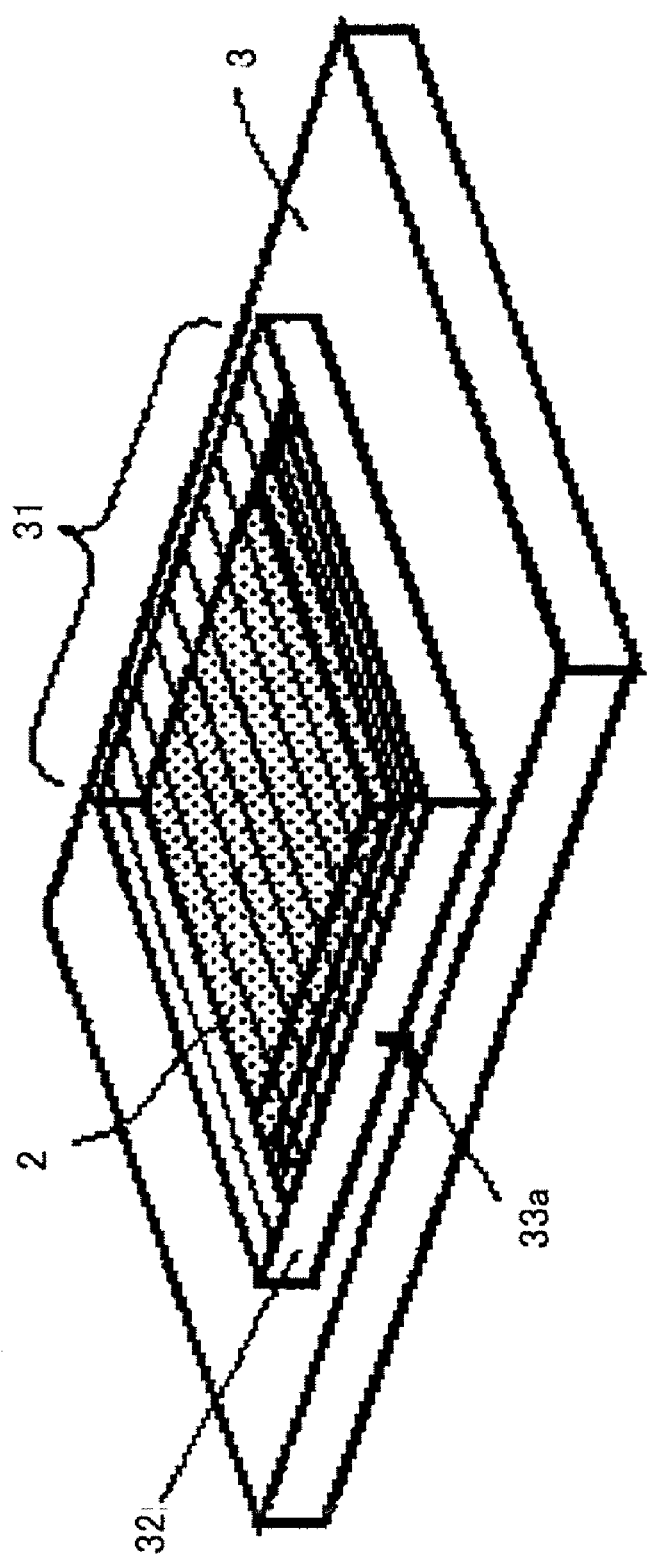
FIG. 10 is a perspective view of the electric field pellicle according to the first embodiment.

FIG. 9 is a view viewed from the reticle patterned surface of this embodiment, and FIG. 10 is its perspective view. The electric field pellicle is provided to the reticle stage so that the electric field pellicle covers the reticle 2 and the reticle chuck 7. Therefore, the electric field pellicle of this embodiment can be scanned with the reticle stage 3 so as to always and entirely cover the reticle 2 and the reticle chuck 7. This structure can restrain the incoming particles onto the reticle side surface and the reticle chuck 7 as well as the reticle patterned surface. In particular, the reticle chuck 7 serves as an electrostatic chuck, generates the electric field near the chuck, and is likely to attract particles. The above structure can restrain these particles.

33a and 33b are electrodes that apply the voltage to the electric field pellicle via the reticle stage 3. The voltage application method of this embodiment alternately applies the voltage to each wire electrode, but the present invention is not limited to this method as long as the method provides a similar particle preventive effect. For example, the voltage may be applied to plural wire electrodes.

Figure 11:
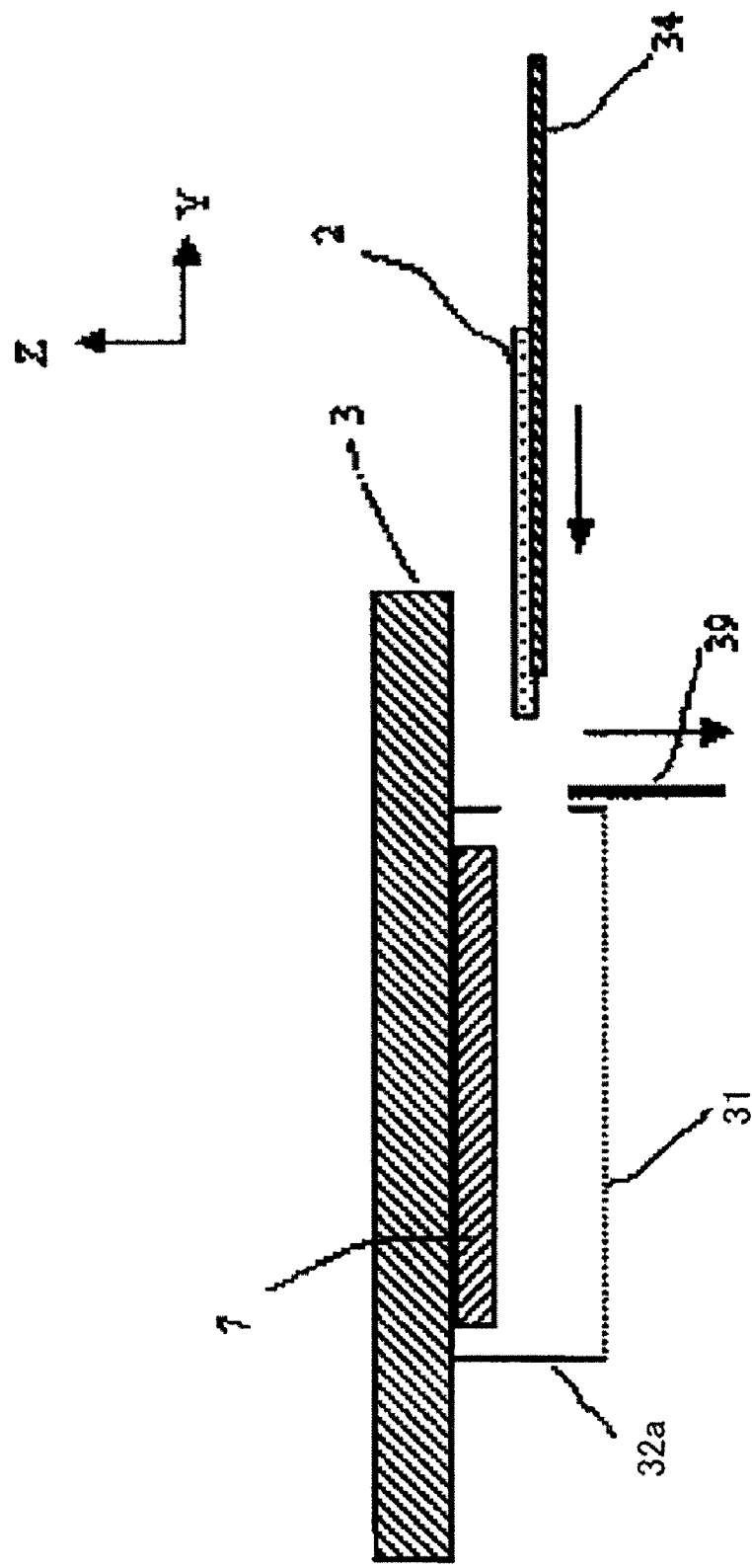
FIG. 11 is a first reticle carrying step A applicable to the first embodiment.
Figure 12:
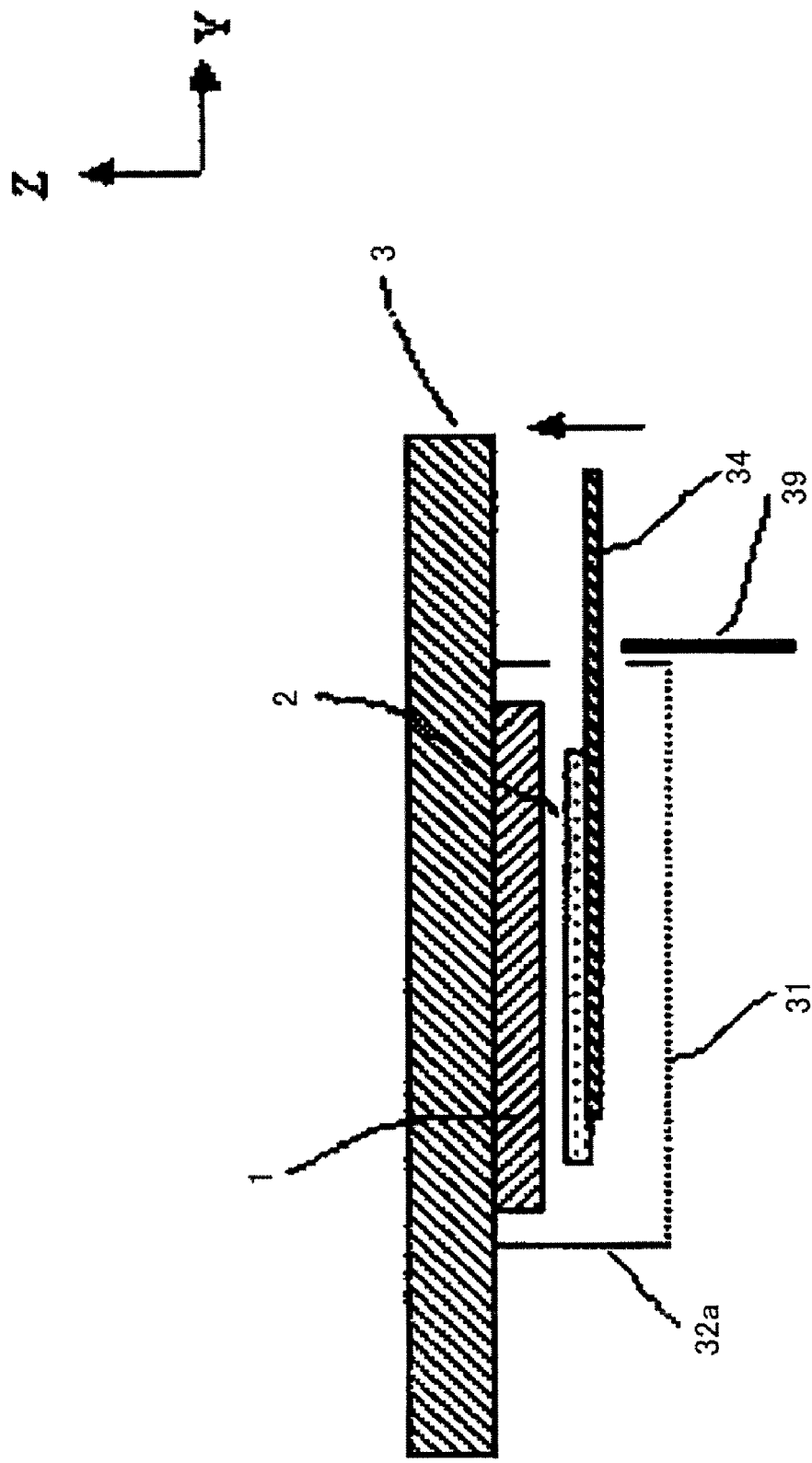
FIG. 12 is a first reticle carrying step B applicable to the first embodiment.
Figure 13:
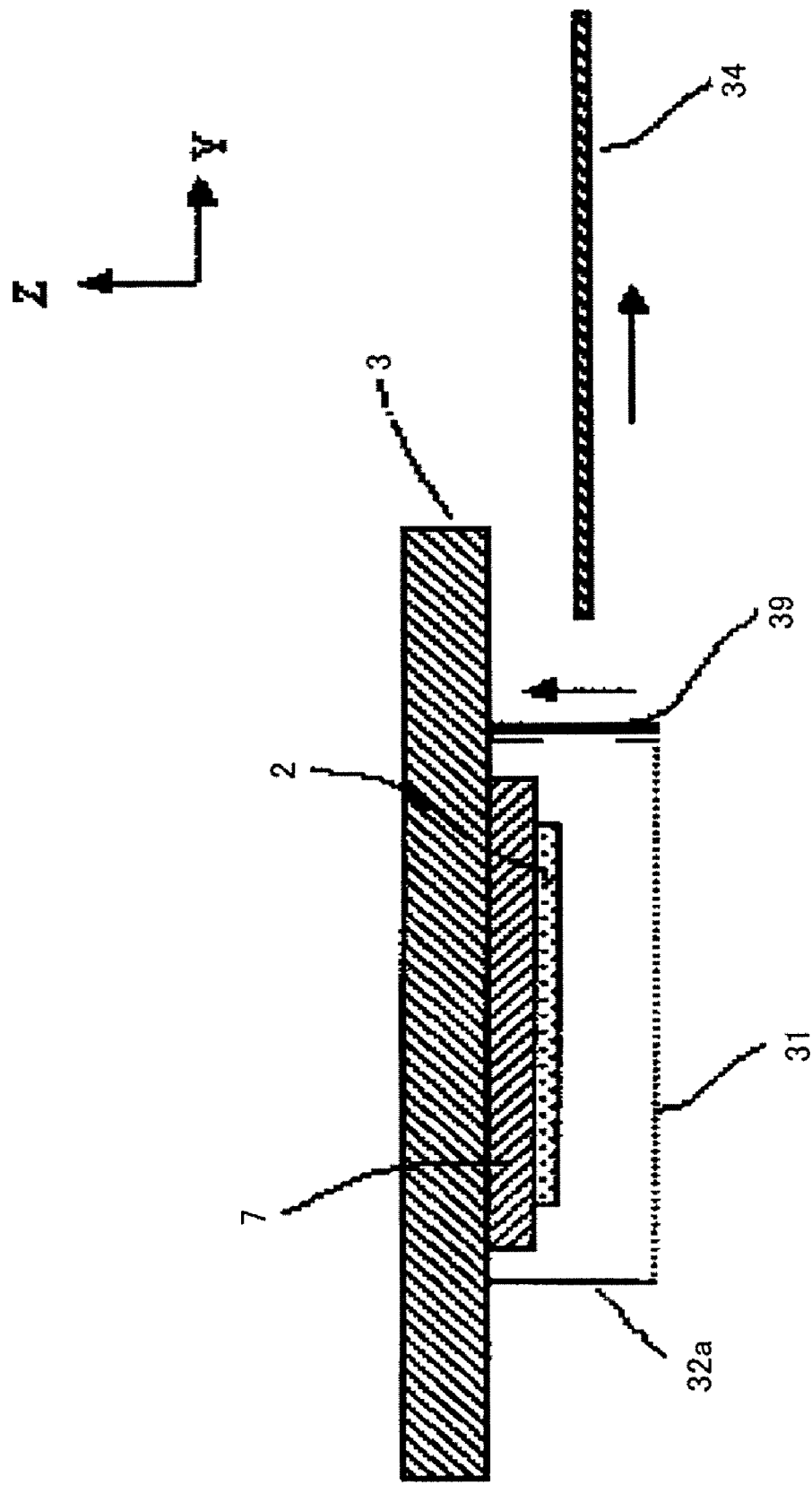
FIG. 13 is a first reticle carrying step C applicable to the first embodiment.

Referring now to FIGS. 11, 12, and 13, a description will be given of the reticle transport of this embodiment. This embodiment provides the electric field pellicle onto the reticle stage 3, and holds the reticle 2 on the reticle chuck 7. As shown in FIG. 11, this embodiment characteristically uses a gate 39 as an opening/closing mechanism on a pellicle frame side surface. In FIG. 11, as soon as the transport of the reticle 2 begins, the gate 39 opens. Next, after the reticle 2 is fed to a predetermined position as shown in FIG. 12, a carrier hand 34 moves up to hold the reticle on the reticle chuck 7. Finally, as shown in FIG. 13, the carrier hand 34 is pulled out, and the gate 39 closes, This action completes the reticle transport.

Figure 14:
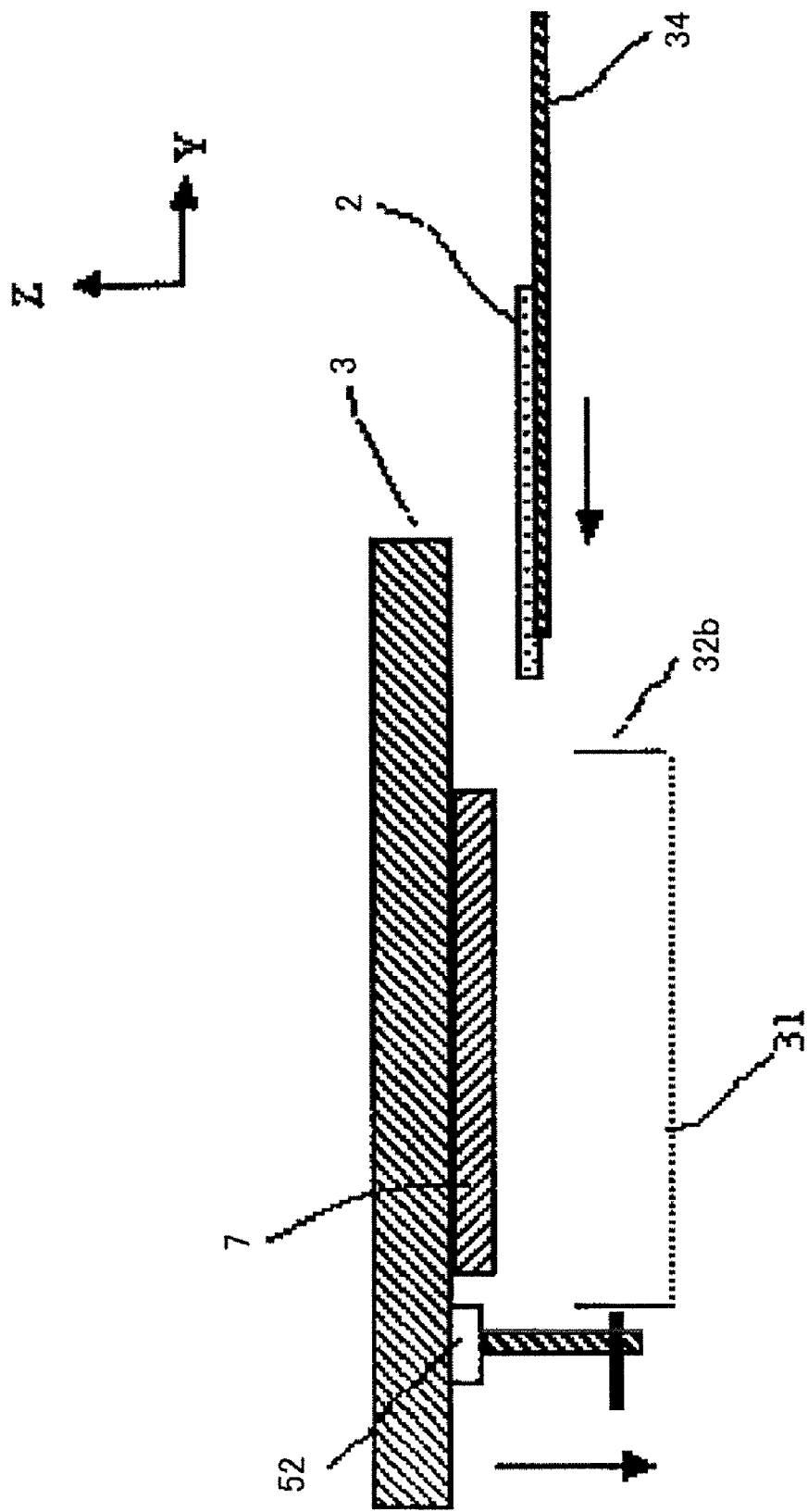
FIG. 14 is a second reticle carrying step A applicable to the first embodiment.
Figure 15:
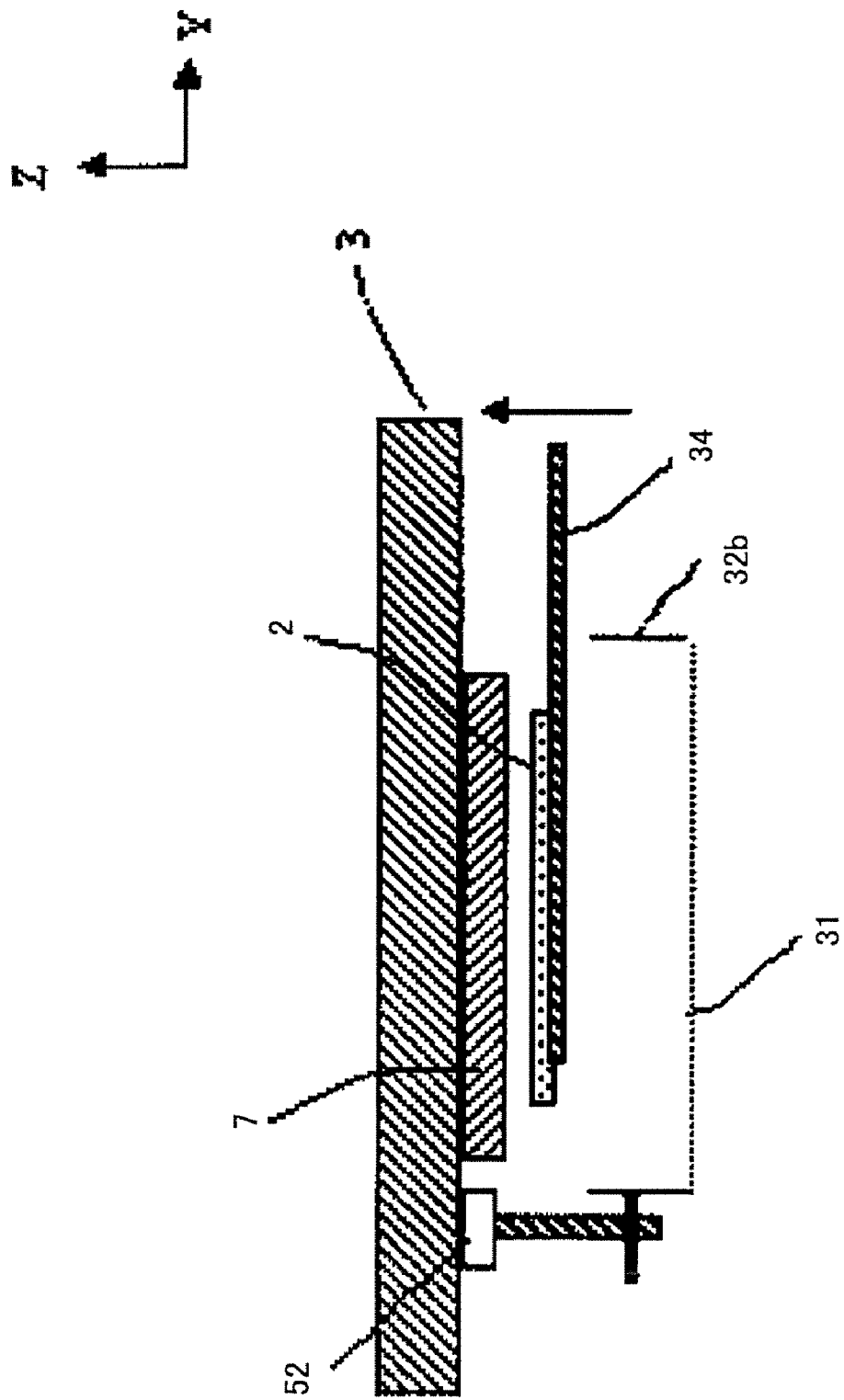
FIG. 15 is a second reticle carrying step B applicable to the first embodiment.
Figure 16:
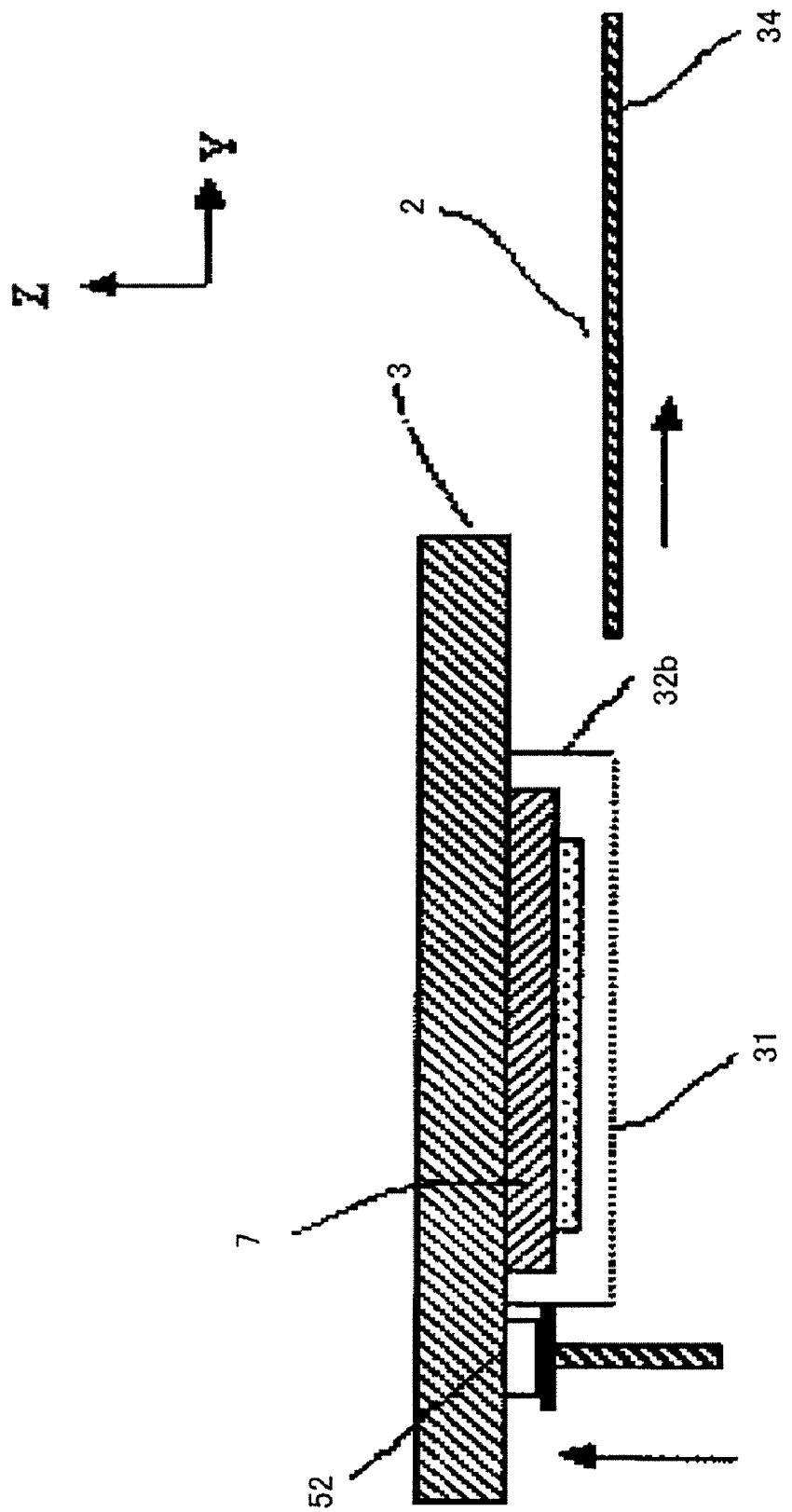
FIG. 16 is a second reticle carrying step C applicable to the first embodiment.

In addition, a driving mechanism that moves up and down the electric field pellicle may be provided as shown in FIGS. 14, 15, and 16. In FIG. 14, as soon as the transport of the reticle 2 begins, an electric field pellicle driving mechanism 52 descends the entire electric field pellicle frame. In that case, the reticle stage 3 and the wire electrode frame 32b are separable from each other, and the reticle 2 is fed to a predetermined position as shown in FIG. 15 while the reticle stage 3 is being separated from the wire electrode frame 32b. Then, an up/down mechanism of the carrier hand 34 moves up the reticle 2 to hold the reticle on the reticle chuck 7. Finally, as shown in FIG. 16, the carrier hand 34 is pulled out, and the electric field pellicle driving mechanism 52 ascends the electric field pellicle to the predetermined position, and completes the reticle transport.

As in this embodiment that provides the electric mesh near the reticle patterned surface, the optical influence, such as uneven illuminance, is concerned. According to US Patent Publication No. 2005/040345, when a support wire of 10 μm is used and arranged apart from a circuit pattern by 2 mm or 10 mm, the uneven illuminance is as much as about 1%. Hence, the uneven illuminance caused by the wire electrode of this embodiment is little influential.

The first embodiment of the present invention has been thus described. While this embodiment provides the electric field pellicle onto the reticle stage 3, the electric field pellicle may be provided on the reticle chuck 7 to provide similar effects.

Figure 17:
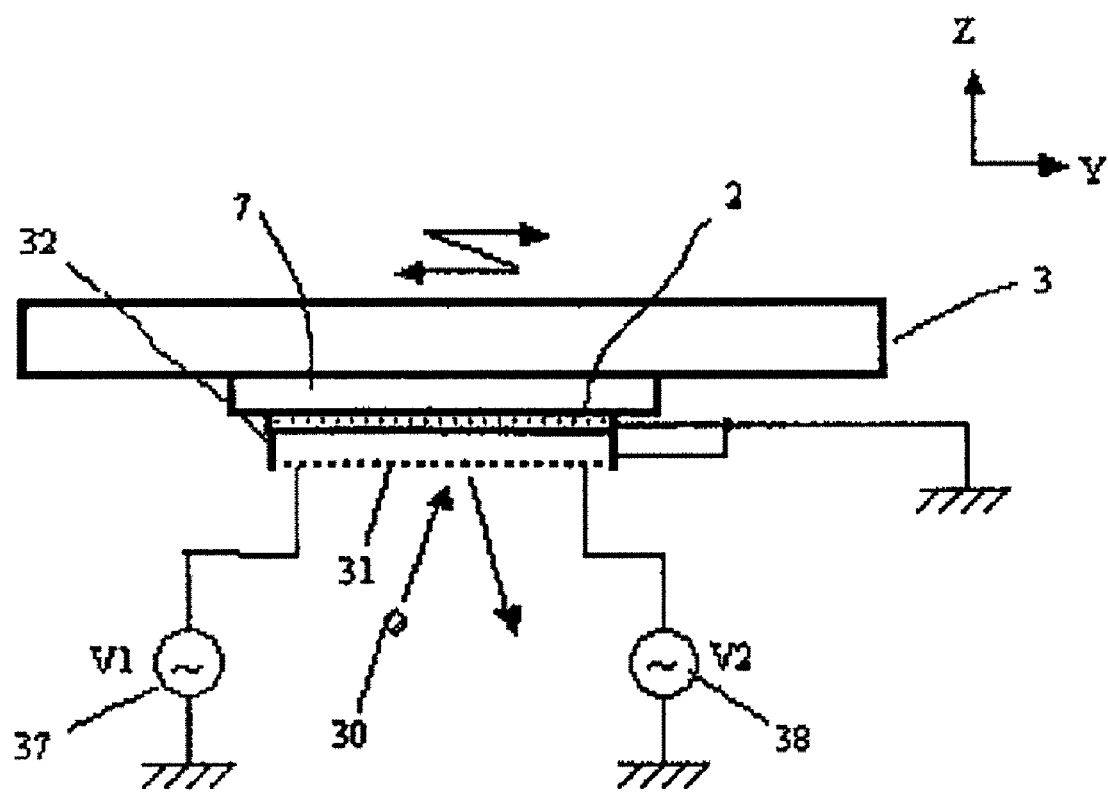
FIG. 17 is a front view of an electric field pellicle according to a second embodiment.
Figure 18:
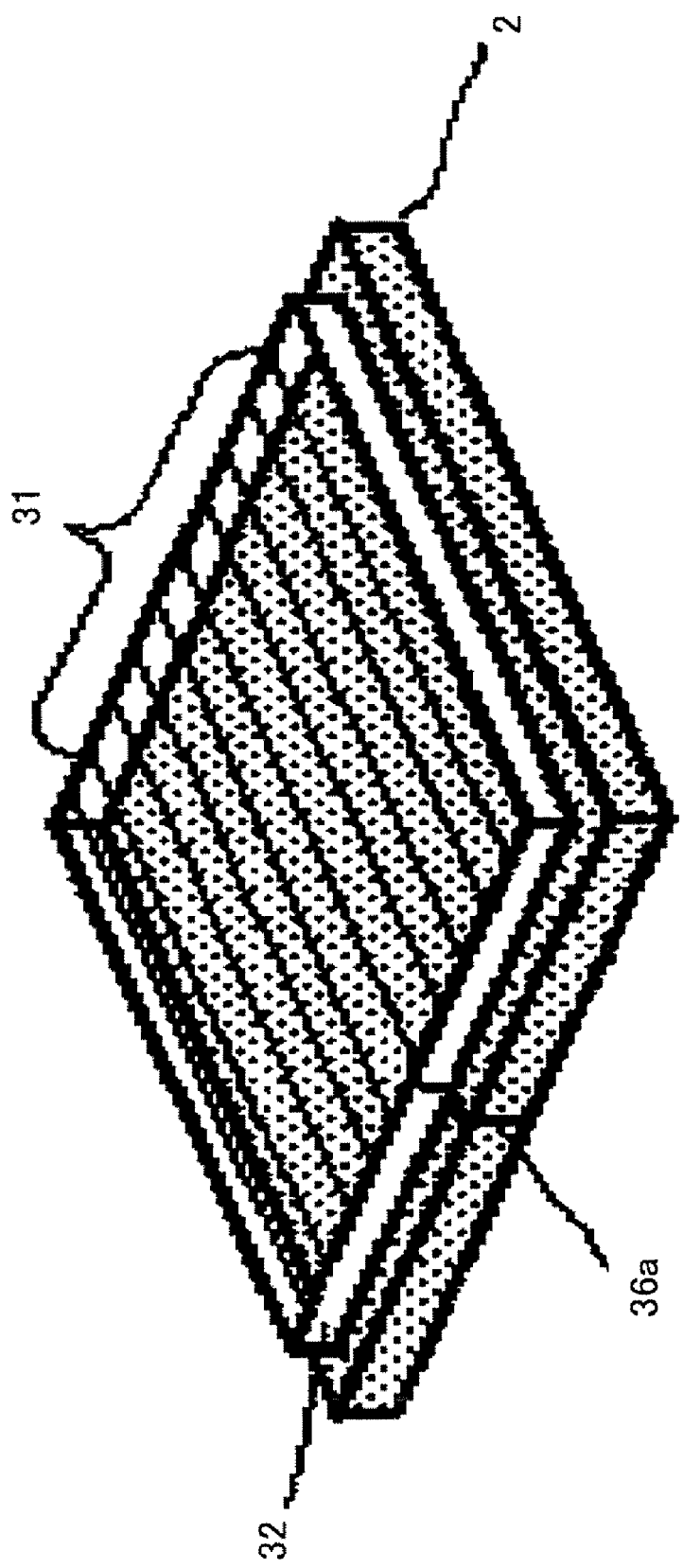
FIG. 18 is a plane view of a perspective view of the electric field pellicle according to the second embodiment.

A description will now be given of a second embodiment that provides an electric field pellicle of the present invention to a reticle substrate, like the conventional pellicle using method. FIG. 17 is a view that applies the electric field pellicle to the exposure apparatus. As illustrated, the wire electrode spreads and covers the whole surface of the reticle patterned surface. A voltage application method for each wire electrode is similar to the first embodiment. Here, FIG. 17 is a front view of the electric field pellicle. FIG. 18 is a perspective view of the electric field pellicle. The reticle patterned surface is grounded to GND so as to prevent charging. The wire electrode frame 32 is grounded to GND so as to reduce the electric field leak. 36a denotes a contact used to apply the voltage from the reticle chuck 7 or the reticle stage 3 when the reticle 2 is absorbed in the reticle chuck 7. The contact electrically connects the power source to the wire electrode row. A contact 36b (not shown) is provided at a position opposite to the contact 36a.

Figure 19:
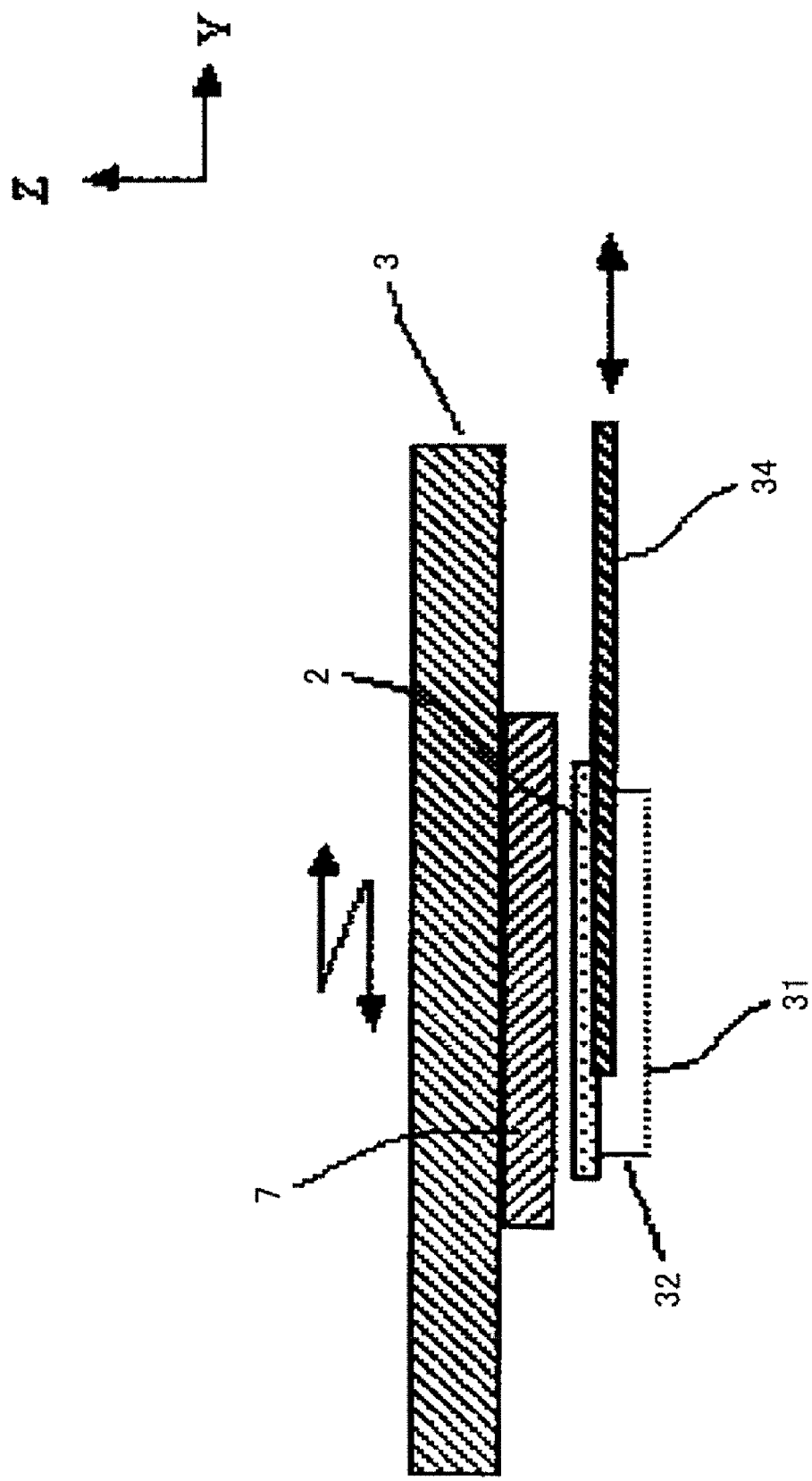
FIG. 19 is a reticle carrying method applicable to the second embodiment

The reticle 2 is carried with the pellicle similar to the conventional exposure apparatus, and thus the transport is easy. FIG. 19 shows this state. The carrier hand carries the reticle to the vicinity of the reticle chuck, and the reticle is absorbed in the reticle chuck using an up/down mechanism of the carrier hand. Then, the voltage is applied to a voltage application contact of the electric field pellicle.

Figure 20:
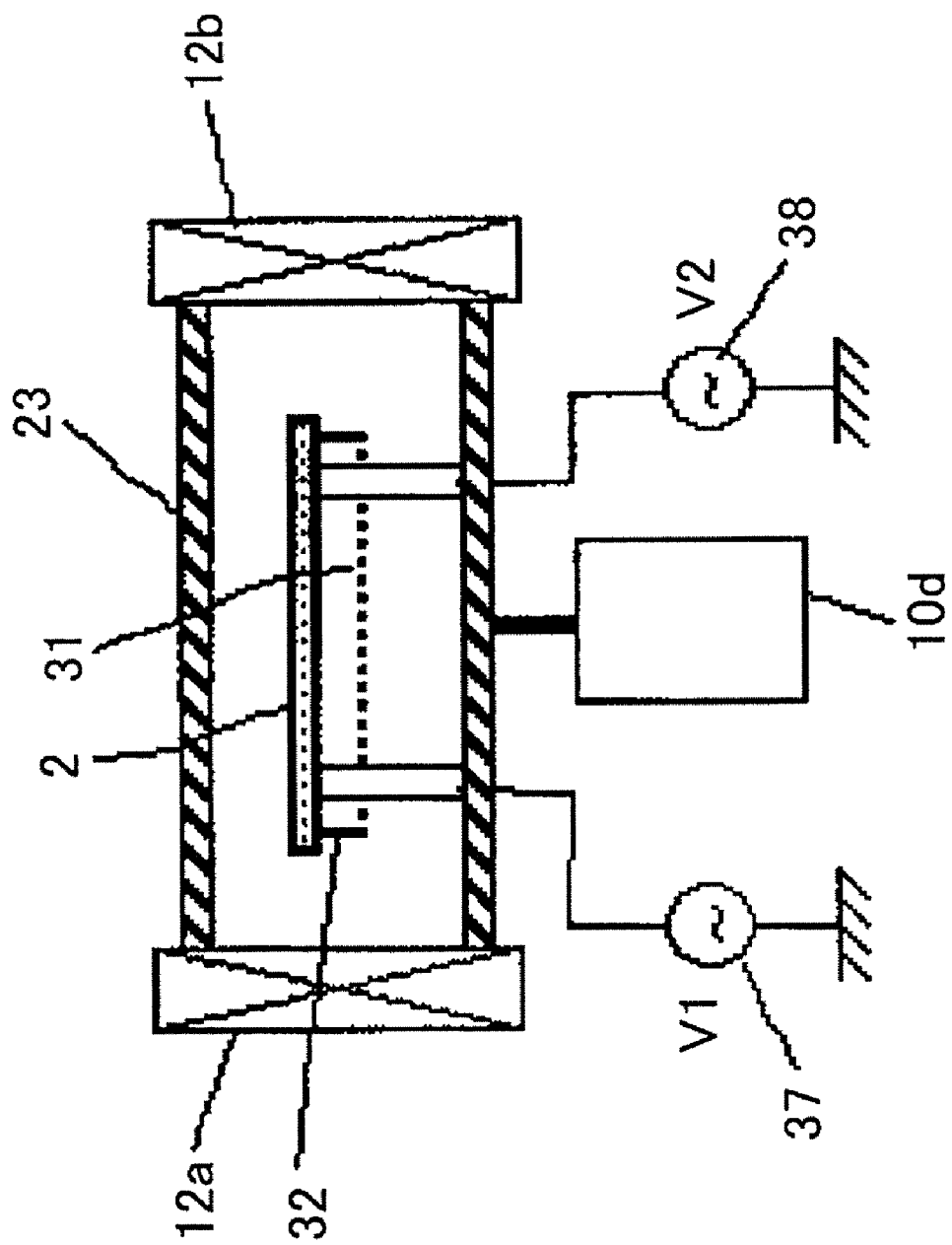
FIG. 20 is a structure of the second embodiment applicable to a load lock chamber.

One characteristic of this embodiment is to restrain the particles similar to the conventional pellicle, and this embodiment is applicable to the inside of the load lock chamber during transporting. FIG. 20 shows this state. 23 denotes a load lock chamber while the reticle is being carried. 12a denotes a gate valve at the side of the exposure apparatus. 12b denotes a gate valve at the side of a reticle exchange chamber. The reticle 2 is supported in the load lock chamber. In importing the reticle, the inside of the load lock chamber is vacuum-pumped, and in exporting the reticle, the inside of the load lock chamber is open to the air. In the atmosphere exchanging operation, AC voltages 37 and 38 are applied from the outside of the load lock chamber to the voltage application contacts 36a and 36b of the reticle so as to activate the electric field pellicle. When the electric field pellicle is active, the adhesions of the particles can be restrained which are likely to occur in the air supply and exhaust of the load lock chamber.

A description will now be given of a third embodiment that provides a method of preventing vibrations or breaks caused by the Coulomb's force that may occur in applying the voltage to the wire electrode. Voltages having phases that are different by 180° are alternately applied to each electrode. A plus charge and a minus charge alternate in the electrode although no current flows. Therefore, the wires are expected to attract each other through the Coulomb's force. The Coulomb's force generally occurs in the parallel wire electrodes as expressed below, where it is assumed that when the voltage is applied to the electrode, charges having linear densities of ±ρ [C/m] occur on the parallel electrodes with an interval d [m]. An attraction is generated as a force per unit length:

$$F = \frac{-\rho^2}{2\pi\varepsilon_0 d}[N] \qquad \text{EQUATION 4}$$

The number of electrodes is not two, but the electrodes are configured as an electric row. Respective electrodes attract each other with the force F, and the resultant force is ideally zero as a force that is applied to one wire electrode. However, the resultant force is not always zero due to the disorder of the phase and the disturbance.

The wire electrode used for the electric pellicle needs to reduce its influence on the projected image be as small as possible. Use of the wire electrode of 10 μm or smaller is necessary, and such a wire electrode requires delicate handling. Therefore, a reinforcing member is needed to prevent a break.

Figure 21:
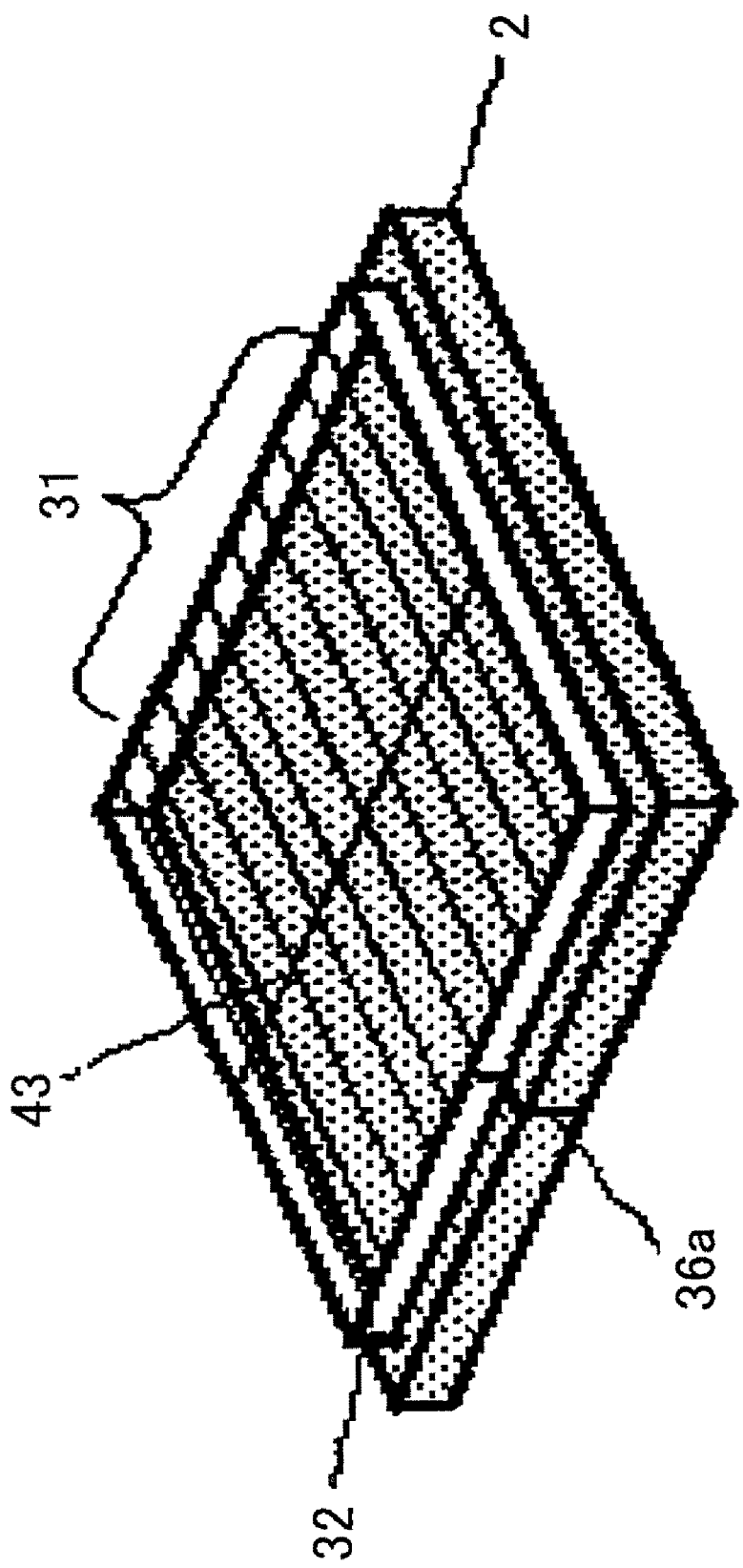
FIG. 21 is a perspective view of an electric pellicle according to a third embodiment.
Figure 22:
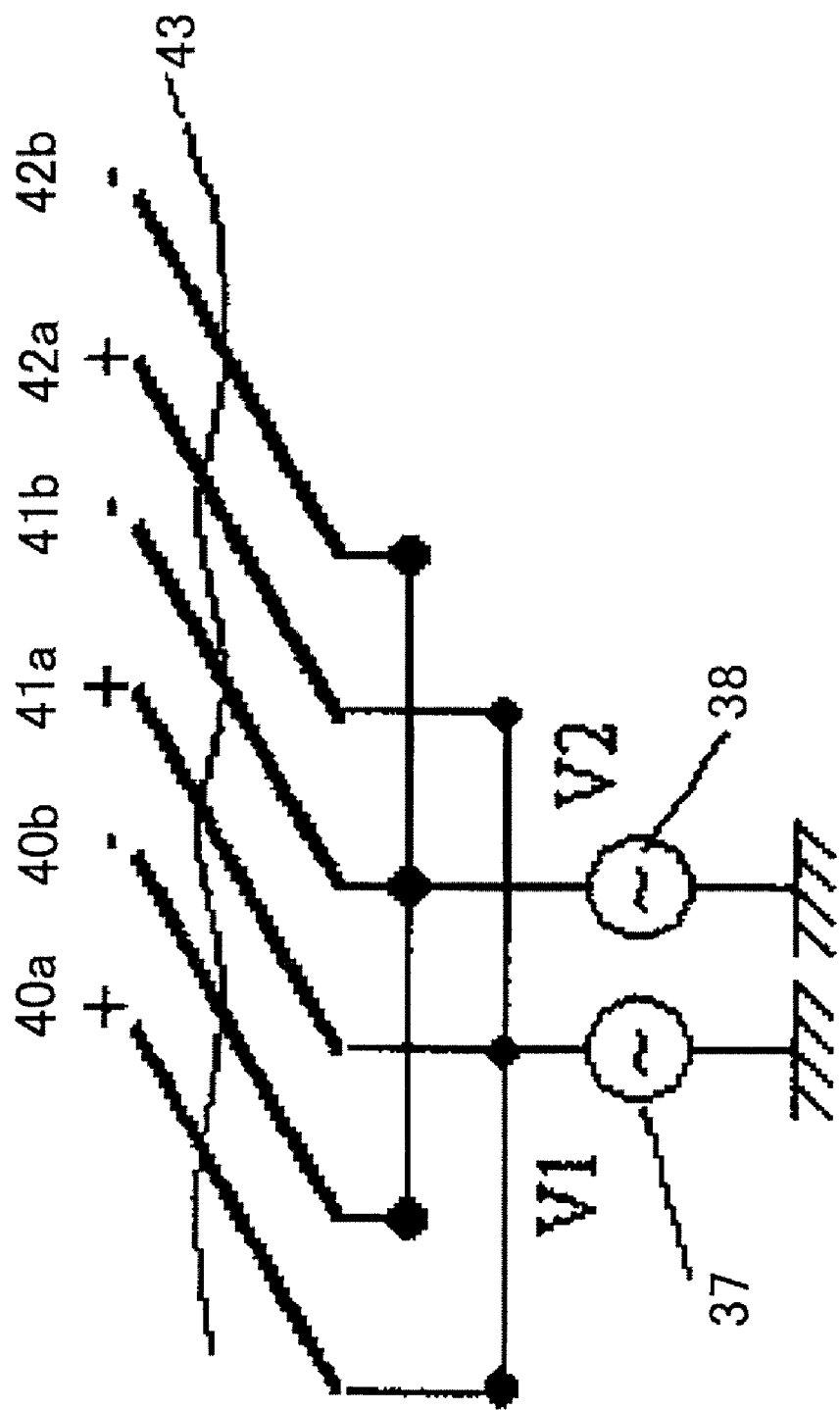
FIG. 22 is an AC voltage application method to a wire electrode according to the third embodiment.

With the foregoing two points in mind, this embodiment connects one insulating wire 43 to the center of the wire electrode in a direction different from the arrangement direction of the wire electrode as shown in FIG. 21, providing a solution for the above problems. A thin, strong, and insulating wire is used an insulating wire. For example, poly(p-phenylenebenzobisoxazole) ("PBO") fabric (trade name zylon), polyethylene ("PE") fabric (trade name Dyneema), PPTA (aramid) fiber (trade name Kevlar), and Polyarylate fiber (trade name Vectran) are conceivable. The insulating wire can be alternately inserted into the wire electrode, as a cloth is woven from a thread, as shown in FIG. 22. Although FIG. 22 shows only one insulating wire for reinforcement, plural insulating wires may be inserted into each wire electrode to increase the strength.

Since this configuration can prevent the vibrations of the wire and reinforce the wire, the electric pellicle can be easily manufactured and handled.

Conventionally, an EUV pellicle is considered nonviable. On the other hand, the present invention arranges plural parallel wire electrodes on a planar configuration near the reticle patterned surface so that they can oppose to each other, and alternately applies voltages having phases that are different by 180°, thereby restraining particles incident upon the reticle patterned surface. According to the present invention, the electric field pellicle always covers the whole surface of the reticle, moves with the reticle in the scan exposure, and restrains the particles from the reticle stage space and the projection optical system space. The electric field pellicle of the present invention does not use a pellicle film, and is made only of wire electrode row. Therefore, the transmittance of the EUV light seldom lowers. The wire electrode is made of metal having a diameter of 10 μm or smaller, and thus its manufacture and assembly are easy. Thus, the present invention can provide a practical EUV pellicle.

Furthermore, the present invention is not limited to these preferred embodiments and various variations and modifications may be made without departing from the scope of the present invention.

This application claims a foreign priority benefit based on Japanese Patent Application No. 2007-100584, filed on Apr. 6, 2007, which is hereby incorporated by reference herein in its entirety as if fully set forth herein.

What is claimed is:

1. An exposure apparatus configured to expose a pattern of an original onto a substrate, said exposure apparatus comprising:

a wire electrode row that includes plural parallel wire electrodes, and that is opposed to the original; and a power source that applies an AC voltage to the plural wire electrodes, wherein the wire electrode row includes a first wire electrode group, a second wire electrode group to which an AC voltage having a phase different from that of an AC voltage applied to the first wire electrode group is applied, and a third wire electrode group to which an AC voltage having a phase different from those of the first and second wire electrode group is applied.

2. An exposure apparatus according to claim 1, wherein the wire electrodes of the first wire electrode group, the wire electrodes of the second wire electrode group, and the wire electrode of the third wire electrode group are sequentially arranged.

3. An exposure apparatus configured to expose a pattern of an original onto a substrate, said exposure apparatus comprising:

a wire electrode row that includes plural parallel wire electrodes, and that is opposed to the original;

a power source that applies an AC voltage to the plural wire electrodes; and a stage configured to move the original, wherein the wire electrode row includes a first wire electrode group, and a second wire electrode group to which an AC voltage having a phase different from that of an AC voltage applied to the first wire electrode group is applied, wherein the wire electrode row is fixed onto a wire electrode frame provided to the stage, wherein the wire electrode frame has an opening and closing mechanism on a side surface, and the original is carried to the stage from the side surface of the wire electrode frame that opens.

4. An exposure apparatus configured to expose a pattern of an original onto a substrate, said exposure apparatus comprising:

a stage configured to move the original that includes a wire electrode row having plural parallel wire electrodes;

a power source that applies an AC voltage to the plural wire electrodes;

a contact configured to electrically connect the power source and the wire electrode;

an exposure chamber configured to house the original to expose the pattern onto the substrate; and a load lock chamber connected to the exposure chamber via a gate valve, wherein the power source applies an AC voltage to a first wire electrode group in the wire electrode row, and another AC voltage to a second wire electrode group having a phase different from that of the AC voltage for the first wire electrode group, wherein the stage, the power, and the contact are provided in the load lock chamber.

* * * * *